United States Patent
Wu

(10) Patent No.: US 6,490,438 B1
(45) Date of Patent: Dec. 3, 2002

(54) MOBILE PHONE HAVING AN IMPROVED SHIELDED DEVICE

(75) Inventor: Kun-Tsan Wu, Tu-Chen (TW)

(73) Assignee: Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/541,864

(22) Filed: Apr. 3, 2000

(30) Foreign Application Priority Data

Mar. 3, 2000 (TW) ...................................... 89203421 U

(51) Int. Cl.[7] .................................................. H04B 1/38
(52) U.S. Cl. ............................ 455/90; 455/300; 361/816
(58) Field of Search .......................... 455/575, 90, 347, 455/351, 300, 301; 361/748, 752, 814, 816; 174/35 R

(56) References Cited

U.S. PATENT DOCUMENTS 5,966,647 A * 10/1999 Sawai ........................ 455/300
6,275,683 B1 * 8/2001 Smith ......................... 455/90

* cited by examiner

*Primary Examiner*—Thanh Cong Le
(74) *Attorney, Agent, or Firm*—Wei Te Chung

(57) ABSTRACT

A case structure of the present invention having an improved EMI shielding comprises a front case, a rear case and a PCB having ground traces and a plurality of electronic components thereon, a conductive elastic member. The front and rear case are made of a metallic material. The rear case includes a bottom, a sidewall and a cavity defined between the bottom and the surrounding sidewall. The bottom forms conductive rails extending into the cavity and cooperating with the ground trace of the PCB. A conductive elastic member is formed on the rails of the rear case by applying viscous conductive resin to the rails. The ground faces of the PCB electrically connect with the conductive rails of the rear case via the conductive elastic member, thus, providing an improved shield consisting of the rear rails, the PCB, and the front rear cases. The imposed shield is simpler to assemble and lower in cost since no additional frame and screws are required.

6 Claims, 4 Drawing Sheets

MOBILE PHONE HAVING AN IMPROVED SHIELDED DEVICE

BACKGROUND OF THE INVENTION

The present invention relates to a case structure of a mobile phone, and more particularly to a case structure of a mobile phone providing improved shielding effectiveness.

Electromagnetic Interference (EMI) is a common and well-known problem associated with electronic equipment. EMI concerns are present in the design of mobile phones. Shielding mobile phones from EMI is essential for optimum signal integrity and communication clarity. U.S. Pat. No. 5,271,056 disclosed a mobile phone having means for protecting components on a printed circuit board (PCB) thereof from EMI, as shown in FIG. 4 of the present application. The mobile phone has a main body (not shown) and a PCB 50 (shown rear side up). A rear side of the PCB is covered by ground foil 501, as is an edge of a front side. A frame plate 60 of conductive metal or metal-coated plastic comprises a flat plate 601 and a raised edge 602 around a perimeter of and bisecting the flat plate 601. The PCB 50 is secured to the frame plate 60 by means of screws 70. The ground foil 501, which at the edge of the PCB 50 is connected to a strip in the component side of the board 50, will together with the raised edge 602 and the plate 601 form a shielding means for shielding electronic components on the PCB facing the plate 601.

The disadvantages of the prior art mobile phone are that it needs an additional metal frame plate 60 and a plurality of screws which are used for securing the PCB 50 to the frame plate 60, thus increasing manufacturing cost and consuming space. Further, it is laborious to assemble the EMI shielding means. Hence, an improved mobile phone having an EMI shield is required to overcome the disadvantages of the prior art.

BRIEF SUMMARY OF THE INVENTION

A main object of the present invention is to provide a case for a mobile phone, and more particularly to provide a case which includes an improved EMI shield for a mobile phone.

The present invention comprises a front case, a PCB, a conductive elastic member and a rear case. The front and the rear case are made of a conductive metal material. The front case includes a keyboard and a display. The PCB is disposed between the front case and the rear case and has ground traces and electronic components thereon which face the rear case. The rear case includes a bottom, a surrounding sidewall and a cavity defined between the bottom and the surrounding sidewall. The bottom forms rails forwardly extending into the cavity. The rails have a shape in conformity with and aligning with the ground traces of the PCB when the PCB is secured in the rear case. A conductive elastic member is formed on the rails and directly electrically connects the ground traces of the PCB. The front case, the rear case, the rails, the elastic member and the PCB together form an EMI-shielding means for shielding the components of the PCB from EMI.

BRIEF DESCRIPTION OF THE DRAWINGS

FIG. 3 is a cross-sectional view taken along the line 3—3 of FIG. 1; and.

DETAILED DESCRIPTION OF THE INVENTION

Figure 1:
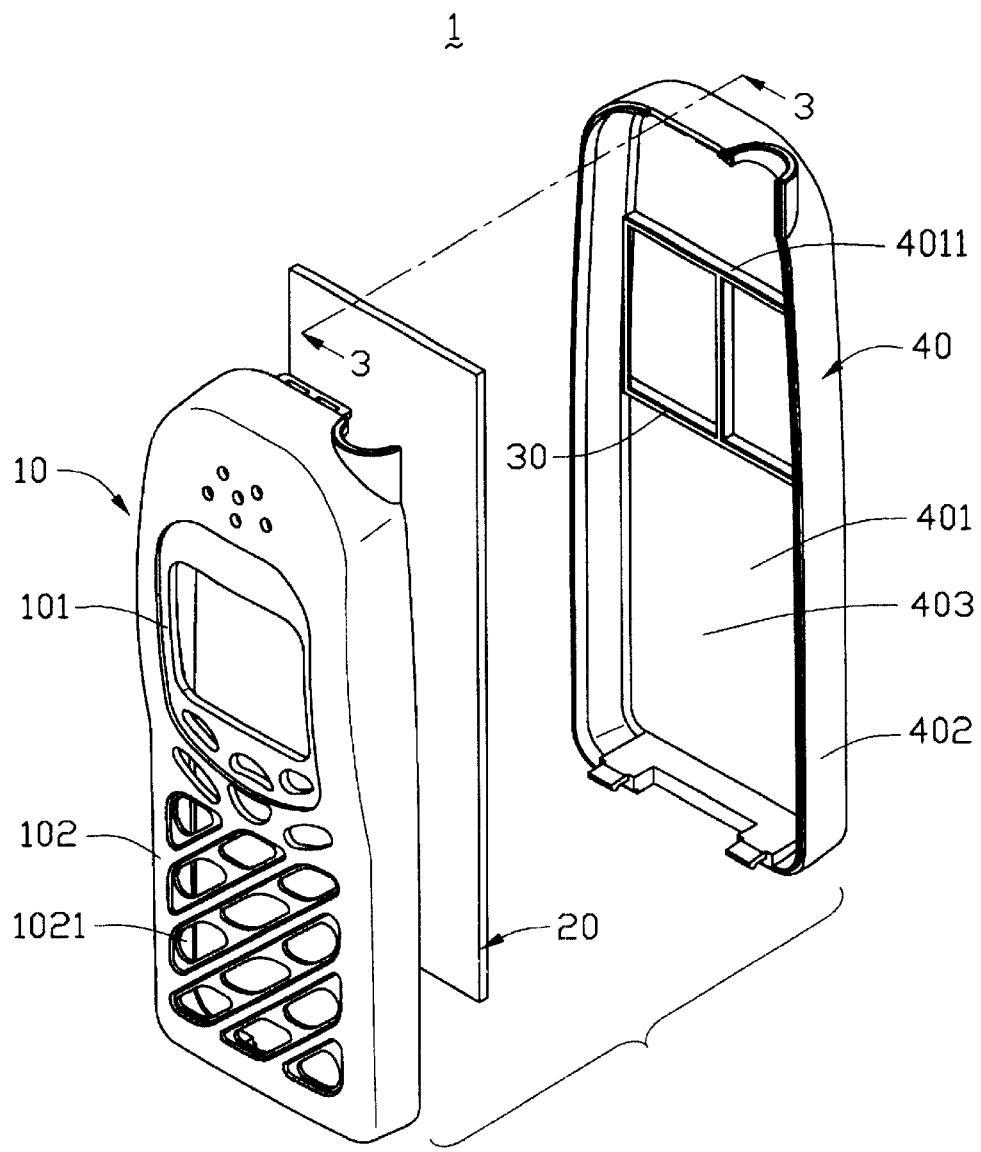
FIG. 1 is an exploded view of a mobile phone in accordance with the present invention.

Referring to FIG. 1. a case structure in accordance with the present invention includes a front case 10, a printed circuit board (PCB) 20, and a rear case 40. The front and rear cases 10, 40 are made of a conductive metallic material, and in the present invention, the preferred metal material is a magnesium-aluminum alloy because it is light and strong. Details of the mobile phone 1 are not disclosed herein because such are well-known in the art.

The front case 10 is of a conventional design and includes a display section 101 and a keyboard section 102. The keyboard 102 includes a series of push buttons openings 1021 through which push buttons (not shown) extend for operating the mobile phone.

Figure 2:
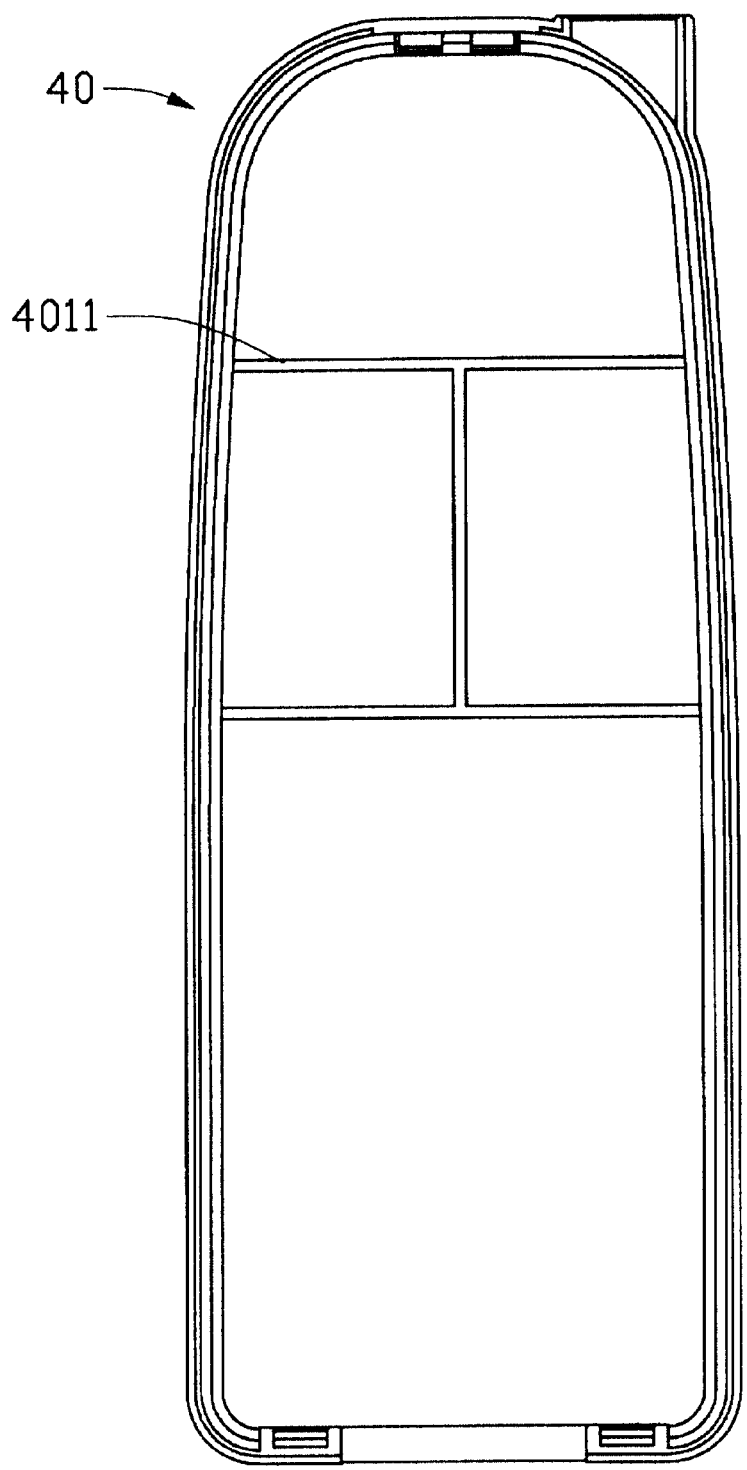
FIG. 2 is a plan view of a rear case of the mobile phone of FIG. 1.
Figure 3:
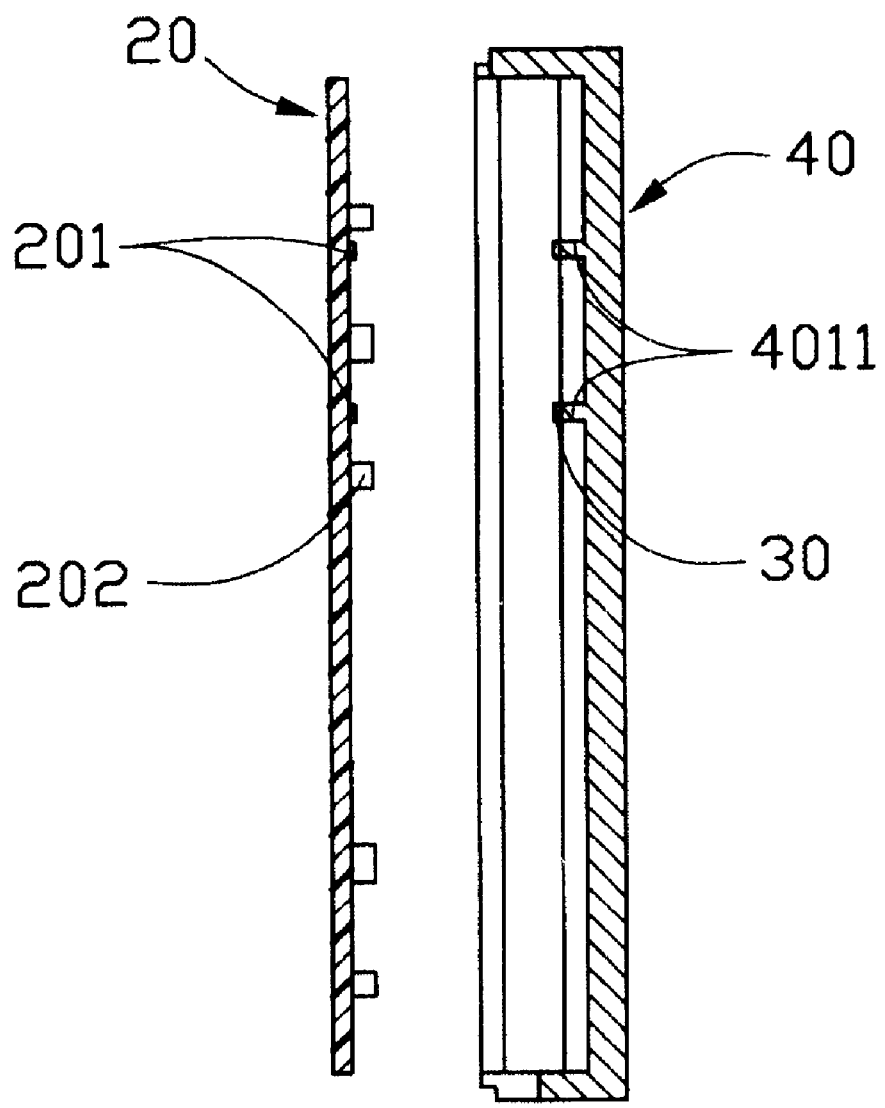
Figure 4:
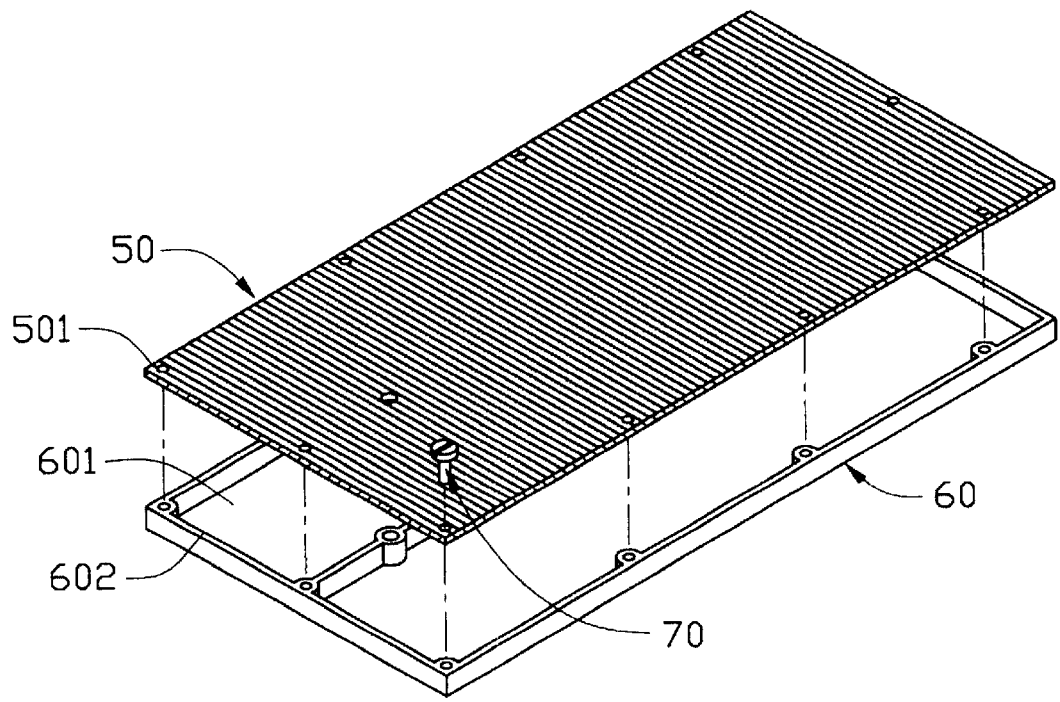
FIG. 4 is a perspective view of an EMI shielding means of a prior art mobile phone.

Also referring to FIGS. 2 and 3, the PCB 20 is disposed between the front case 10 and the rear case 40. The PCB 20 faces the rear case 40 and has ground traces 201 which divides a front face of the PCB 20 into a plurality of areas. Numerous electrical components 202 are mounted on the front face of the PCB 20.

The rear case 40 includes a bottom 401, a surrounding sidewall 402 and a cavity 403 defined between the bottom 401 and the surrounding sidewall 402. The bottom 401 forms rails 4011 forwardly extending into the cavity 403. The rails 4011 have a shape in conformity with the ground traces 201 of the PCB 20 and are aligned with the ground traces 201 when the PCB 20 is secured in the rear case 40. A conductive elastic member 30 is formed on a top edge of the rails 4011 of the rear case 40 by applying viscous conductive resin to the top edge of the rails 4011. The resin is then cured to form the conductive elastic member. The rear case 40 can electrically connect with the ground traces 201 of the PCB 20 via the conductive electric member 30.

When the PCB 20 is mounted within the cavity 403 of the rear case 40, the ground traces 201 of the PCB 20 directly engage with the conductive elastic member 30 formed on the rails 4011 of the rear case 40, thereby shielding the PCB 20 from external electromagnetic noise and dissipating the electrostatic buildup on the PCB 20 to the front and rear case 10, 40 ground. The components of the PCB are divided into groups on the front face of the PCB 20 according to their respective functions, and thus are received in corresponding areas of the rear case 40 separated by rails 4011 which act as shields, thereby preventing the electronic components of different groups from interfering with each other. The rear case 40, the rails 4011, the conductive elastic member 30, and the ground traces 201 of the PCB 20 together form a number of EMI-shielded spaces for the electronic components 202 on the PCB 20.

The present invention includes numerous advantages over the prior art. An EMI-shielded device of the present invention is formed by the front case 10, the rear case 40 with the rails 4011, the PCB 20 and the elastic member 30, without the necessity of an additional metal frame and a plurality of screws for fixing purpose. Thus, the present invention lowers the component cost, and is easily assembled. By the design of the conductive elastic member 40 directly touching the PCB 20 and fixedly engaging with the ground traces of the PCB 20, and the PCB 20 being divided into efferent areas in accordance with the configuration of the rails, the present inventions obtains an optimal EMI protection. Finally, the elastic member 30 can provide a flexible connection between the PCB 20 and the rear case 40; thus, vibration or shock acting on the rear case 40 will have less effect on the PCB.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An EMI shielding device for telephone electronic components mounted on a printed circuit board of a mobile phone, comprising:

ground traces adapted to be formed on the printed circuit board to divide the telephone components into different groups; and a conductive rear case having a bottom and a surrounding sidewall, a cavity being defined between the bottom and the surrounding sidewall, the bottom forming conductive rails extending into the cavity and forming a plurality of shielding spaces for receiving and shielding the different groups of the telephone electronic components, respectively, and a conductive elastic member being formed on the rails for electrically connecting with the ground traces of the PCB when the PCB is mounted to the rear case.

2. The EMI shielding device as claimed in claim 1, wherein the rear case is made of a conductive metallic material.

3. The EMI shielding device as claimed in claim 2, wherein the preferred metallic material is a magnesium-aluminum alloy.

4. The EMI shielding device as claimed in claim 1, wherein the rails of the rear case have a shape in conformity with and aligning with the ground traces of the PCB.

5. The EMI shielding device as claimed in claim 1, wherein the shielding device further includes a conductive front case for connection with the rear case to enclose the PCB therein.

6. A mobile phone comprising:

a front case;

a rear case owning conductive characteristics thereof;

said rear case including a bottom and a surrounding side wall commonly defining a cavity therein;

a printed circuit board positioned in the cavity;

ground traces formed on a surface of the printed circuit board facing to said bottom;

conductive elastic members positioned between the rear case and the printed circuit board and abutting against the ground traces; wherein said conductive elastic members not only electrically performs grounding/shielding functions in a lateral direction relative to a perpendicular direction of the bottom, but also mechanically provides buffer functions in said perpendicular direction.

* * * * *